Dec. 13, 1966 D. E. PORCH 3,292,131

DEVICE FOR INTERCONNECTION OF ELECTRICAL APPARATUS

Filed Dec. 20, 1963 2 Sheets-Sheet 1

INVENTOR.
DOUGLAS E. PORCH

BY

Owen, Wickersham & Erickson
ATTORNEYS

Dec. 13, 1966 D. E. PORCH 3,292,131

DEVICE FOR INTERCONNECTION OF ELECTRICAL APPARATUS

Filed Dec. 20, 1963 2 Sheets-Sheet 2

INVENTOR.

DOUGLAS E. PORCH

BY

Owen, Wickersham & Erickson

ATTORNEYS

United States Patent Office 3,292,131
Patented Dec. 13, 1966

3,292,131
DEVICE FOR INTERCONNECTION OF ELECTRICAL APPARATUS

Douglas E. Porch, Hayward, Calif., assignor of ten percent to William J. Smith, Kentfield, Calif.
Filed Dec. 20, 1963, Ser. No. 332,059
11 Claims. (Cl. 339—14)

This invention relates to electrical wiring circuits, and more particularly it relates to a device for interconnecting components of electrical equipment commonly used in electronic systems.

Modern well equipped aircraft require a large amount of electronic equipment in order to provide adequate navigation, stabilization and control, and communication systems. Such systems are generally made up of a plurality of electronic components including various power supplies, controls, sensors, receivers, transmitters, antennae and indicators. When installed all of these components must be properly interconnected, and since each component may have from a few to a large number of electrical leads, the problem of properly connecting and installing this electrical equipment becomes highly complex. Prior to the present invention, electrical components were interconnected primarily at junction boxes within the aircraft or in some instances by being connected point-to-point. The latter means was extremely difficult to service while the junction boxes heretofore devised were large, bulky, and had other important disadvantages. Within the junction boxes the various component leads were generally connected to terminals by screws, washers, clips and other well known fittings. This arrangement contributed little toward reducing the complexity of the overall installation procedure for electronic equipment, and instead required highly skilled labor as well as a large amount of time both in preparation for and during the actual installation.

One general object of the present invention is to greatly simplify the problem of installing and interconnecting complex electronic equipment comprised of a plurality of electronic components by means of a pre-engineered interconnecting terminal board that will enable the various system components to be installed and interconnected to form an integrated reliable system with a minimum of time and without the need for highly skilled labor during the installation. Stated more specifically, one principal object is to provide an electrical circuit interconnection board particularly adapted for installation in aircraft that will receive and retain all of the large number of wire leads for a plurality of components of an aircraft electronic system while electrically interconnecting certain of the wires by fixed circuitry within the board.

Another object of my invention is to provide a device for the interconnection of electrical components in electronic systems that is unusually light and compact for the number of lead members which it can accommodate and which is thus particularly advantageous for use in aircraft.

Still another object of the present invention is to provide an electrical interconnection device that is particularly well adapted for ease and economy of manufacture.

A further object of my invention is to provide a printed circuit terminal board for interconnecting electronic components in aircraft which is internally insulated and thus capable of accommodating a wide range of electrical current values without the danger of arcing or short circuiting even during high altitude operation.

Another object of the invention is to provide an electrical terminal board for interconnecting electronic components which is particularly well adapted for withstanding severe environmental climates such as vibration, humidity, combined high altitude and low temperature, etc.

In fulfilling the aforesaid and other important objectives the present invention contemplates an electrical interconnection board having a unique construction with a series of terminal receptacles embedded within the board so that they are securely mounted or locked therein. Each of the receptacles forms a solid connecting terminal that is firmly held in place and cannot become loosened, and which is interconnected internally within the board by conductive paths to another like receptacle or receptacles in accordance with a pre-engineered circuit layout. The openings to the terminal receptacles are recessed from the plane surface of the board and adjacent to the opening for each is an appropriate marking which designates the lead of the particular electronic component which can thus be easily connected to the terminal by means of a well known taper pin connector. An important feature of my invention, as will become apparent from the following description, is that my unique terminal board construction can be readily modified to accommodate a plurality of printed circuit boards sandwiched and permanently bonded together with receptacles locked in place and capable of receiving standard taper pin connectors.

Other objects, advantages and features of the present invention will become apparent from the following description presented in accordance with 35 USC 112 and taken in conjunction with the drawings, wherein.

Figures 3A, 4:
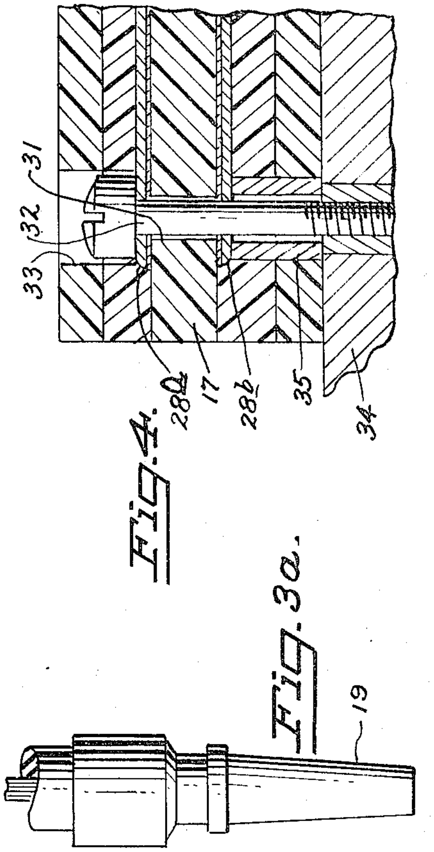
FIG. 3 is an enlarged fragmentary view in elevation and in section of the printed circuit board of FIG. 2 and taken along the line 3—3 thereof.
Figure 5:
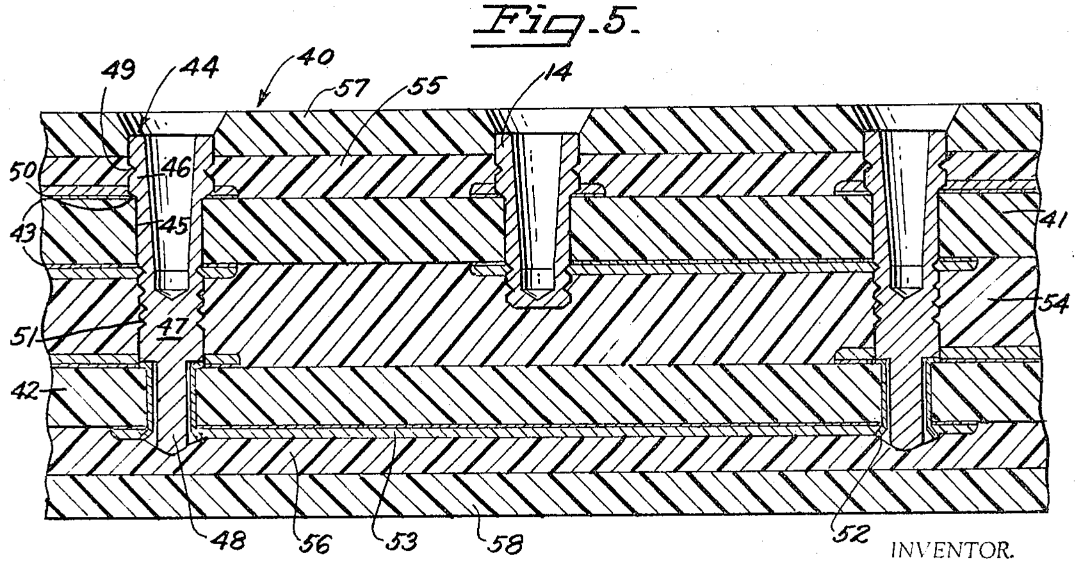

FIG. 3*a* is a view in elevation showing a typical taper pin connector on an electrical lead;

FIG. 4 is an enlarged fragmentary view in elevation and in section showing one corner of a terminal board according to the invention and taken along the line 4—4 thereof;

FIG. 5 is an enlarged fragmentary view in elevation and in section of a modified form of printed circuit terminal board according to the invention.

Figure 1:
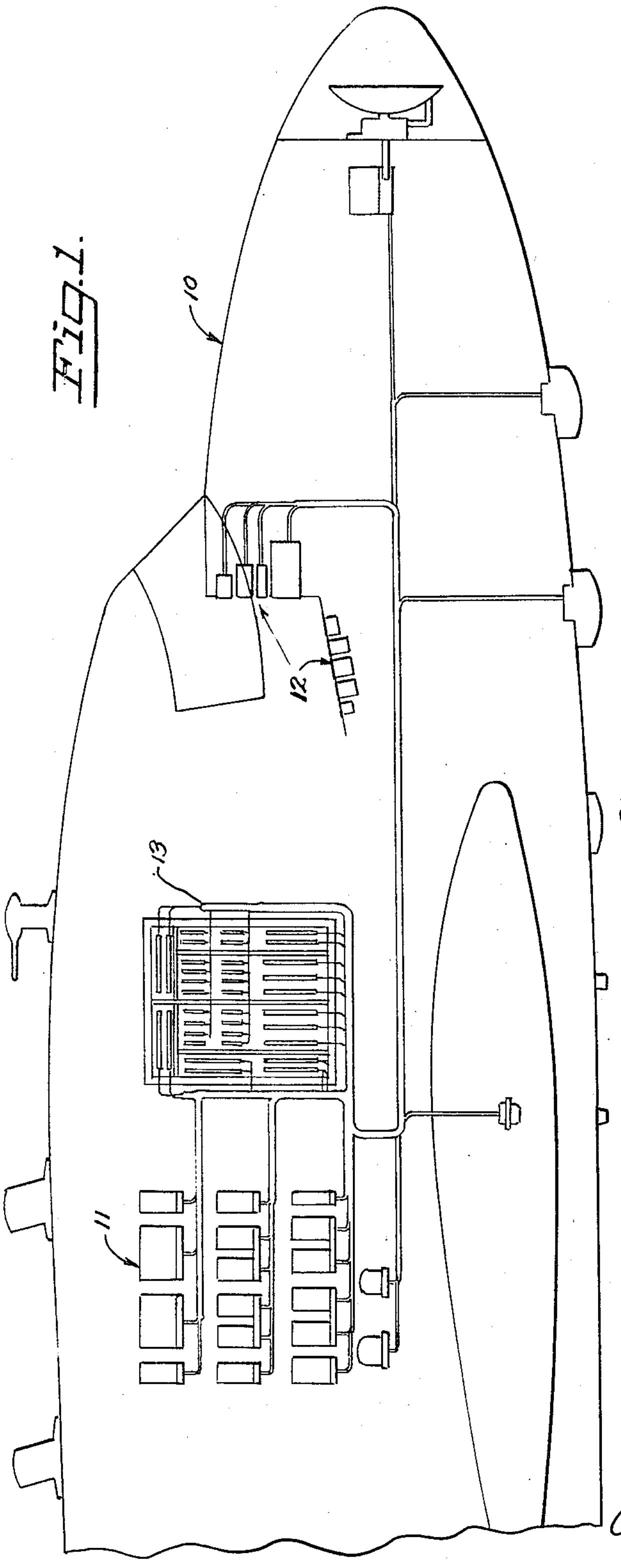
FIG. 1 is a fragmentary schematic view in section of an aircraft showing somewhat schematically a typical arrangement of electrical components for various electronic systems interconnected by a series of printed circuit terminal boards in accordance with the invention.

With reference to the drawings, FIG. 1 shows schematically a portion of an aircraft 10 equipped with a number of electronic systems, each of which is composed of several electrical components including the appropriate controls or instruments and black boxes. The electronic components or black boxes such as system power supplies are generally indicated by the numeral 11 and the aircraft instruments and controls by the numeral 12. The size, number and location of the components and instruments 11 and 12 that are shown are merely representative of those that would be required for a typical modern well equipped aircraft. In an actual aircraft installation each electrical component or instrument may have from two or three to seventy-five electrical leads. In accordance with the present invention, each of these leads is connected at a predetermined location to one of a group of terminal boards 13 shown grouped together in a typical aircraft installation in FIG. 1. All of the terminal boards 13 preferably have a rectangular shape, the size of each depending on the number of components that the particular board must accommodate. The terminal boards 13 are relatively thin so that when grouped together the entire assembly will lie flat against the appropriate aircraft structure without requiring a large amount of space. The compact construction of my terminal board enables a group of boards to be arranged in various ways to fit into the unusually limited space afforded in aircraft. Thus, the boards for different electronic systems may be spread apart or grouped together in the same plane or they can be stacked in a cubical arrangement.

Figure 3:
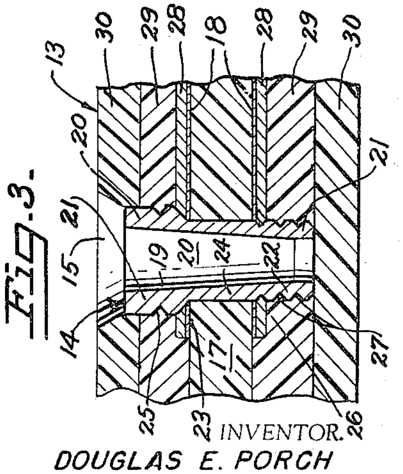
Figure 2:
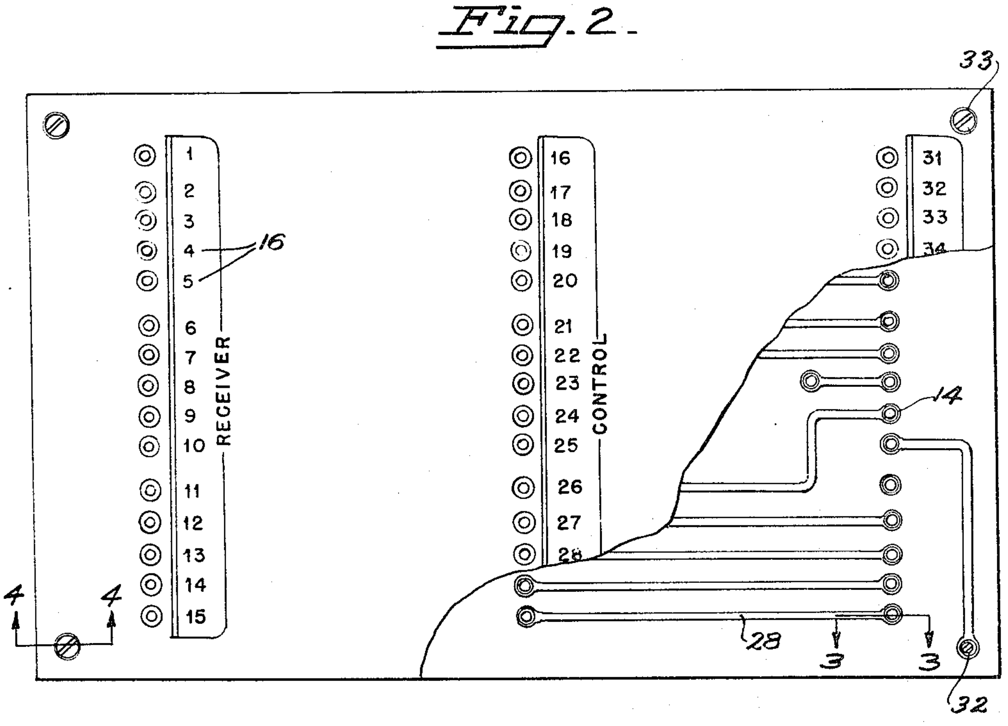
FIG. 2 is a plan view of a typical printed circuit terminal board embodying the principles of the invention with a portion broken away to show internal structure.

A typical printed circuit board 13 embodying the principles of the invention is shown in FIG. 2 and in the cross-sectional view of FIG. 3. Essentially, it comprises a large plurality of terminal sockets or receptacles 14 arranged in a predetermined order with recessed openings 15 on its surface. Preferably the sockets 14 are arranged in rows and each is meant to receive a particular electrical component lead. Additionally, each socket opening 15 is marked adjacent thereto with some suitable indicia such as the numbers 16 or the appropriate wire function to identify it properly for connection with a specific component lead in the system being installed. Each number or designated wire function on the board will correspond to a similar identification for a pin connection on the related electrical equipment. Within the board the receptacles 14 are interconnected electrically to one or more similar receptacles, so that by merely inserting the proper leads of various electrical components into the board, the interconnection of the components is accomplished. Because of the permanent internal circuitry within the board the equivalent of many lead connections may be made by connection of one lead with a terminal.

Internally the board 13 comprises a central base board 17 made of a suitable rigid non-conductive material such as fiber glass which is originally manufactured with a uniform layer of copper laminate completely covering one or both of its sides. These copper layers are utilized to form predetermined printed circuit patterns made up of conductive paths 18 for interconnecting the receptacles 14 that will electrically connect together the various components of an aircraft electronic system.

The actual printed circuit pattern of conductive paths on both of the copper layers 18 are formed by any suitable process heretofore used in printed circuit devices. In one well known method a rough system master form of the circuit pattern for the terminal board is first made up by engineering all of the necessary electrical connections that must take place between the wires of the various system components. This master form is then modified where necessary to satisfy requirements of size, to make the interconnection circuits compatible with other related systems, and to provide a circuit pattern. The printed circuit format may be accomplished by actually laying out the circuit in the well known tape and ink manner on a temperature stabilized medium such as Mylar film. A separate layout may be made for each side of the base board. After the circuit is rechecked to see if it provides the proper interconnection scheme, it is scaled to the desired size and photographed, the resultant negative being the printed circuit master or master drawing for the interconnection of the particular electronic components involved.

After the printed circuit master is formed, as described above, the base board 17 having the desired dimension is selected and is photo exposed with the circuit master using standard photographic techniques. Thus, on both sides of the base board, the desired circuit pattern is formed photographically and the board is then immersed for a predetermined period of time in an etchant fluid that removes all of the conductive copper laminate except that forming the predetermined conductive paths 18 of copper which are permanently fixed to the base board. With the conductive paths or bars 18 thus formed on the base board 17, a hole is bored at the ends of each conductive bar to receive a receptacle 14 according to the invention. The construction of the terminal receptacles 14 and their connection to the board 13 is an important feature of the present invention. Each is made of a suitable conductive material and shaped internally to receive a standard taper pin type of electrical lead connector 19, as shown typically in FIG. 3*a*. Therefore, each receptacle 14 must not only be able to grip a taper pin connector 19 tightly to secure it and maintain a good electrical contact, but it must also be well anchored to the base board 17 so that it will maintain good electrical contact with its conductive bar 18. The unique terminal devices 14 of the present invention fulfill both of these requirements.

As shown in detail in FIG. 2, each taper pin receptacle 14 for a circuit board 13 having a single printed circuit base board 17 has a generally cylindrical shape and a central bore 20 that tapers inwardly from its upper end. The length of each terminal member 14 is substantially longer than the combined thickness of the central base board 17 and the conductive bars 18 thereon so that its end portions 21 and 22 extend above and below the base board 17 when the receptacles 14 are installed therein. The upper end portion 21 has a greater diameter than its hole in the base board 17 at the ends of the bars, and it is connected by a tapered shoulder 23 to the main body portion 24. On the upper enlarged portion 21 above the tapered shoulder 23 is a circumferential groove 25 preferably having a wedge shaped cross-section. When properly inserted into the holes of the central base member 17 during the assembly of the board 13, the smaller end of the shoulder 23 is immediately adjacent to the upper surface of the base member. Just below the central cylindrical portion 24 and on the end portion 22 that extends below the base board are a similar pair of circumferential grooves 26 and 27. These grooves 25, 26 and 27 and the tapered shoulder 23 on each receptacle 14, as will be hereinafter described, serve an important function in firmly securing the terminal to the base board 17. In addition, the groove 26 and the shoulder 23 provide means for making a strong, durable electrical connection between each receptacle 14 and the internal conductive paths that electrically connect it to another receptacle.

For most circuits the relatively thin conductive layers 18 of copper of the printed circuit pattern does not provide enough conductivity to handle the current loads that are applied during use of the various aircraft circuits. Therefore, an additional layer 28 of solder or some other suitable conductive material is applied to the bars 18 to increase their current carrying capacity, and also to provide a means in combination with the shoulder 23 and the groove 26 to help lock the terminal members 14 in place on the central board member 17.

As shown in FIG. 3, the length of the central cylindrical section 24 on each terminal 14 from the shoulder 23 to the first lower groove 26 is substantially equal to and preferably slightly greater than the thickness of the central base member 17, plus the thicknesses of the conductive bars 18. Thus, at each terminal receptacle 14 the conductive bars 18 are located on the inner edge of the shoulder 23 on one side of the base board 17 and just inside the inner edge of the groove 26 on the other side of the base board. In constructing a board 13 such as shown in FIGS. 2 and 3 in accordance with the invention, all of the receptacles 14 are first inserted snugly within the bored holes in the central base member until their shoulders 23 are engaged with the upper surface of the central base member 17. The layer 28 of solder is then applied to the copper bars 18 in any suitable manner such as by the well known dip method wherein flux is applied to the surfaces of the bars 18 before the entire base board 17 is dipped in a bath of molten solder. When the solder is applied to the conductive bars 18 of the base member 17 it flows around each member 14 at the end of a conductive bar. Near the upper end 21 of each receptacle 14 the solder flows around and under the tapered shoulder 23 and thereby forms a locking connection between the terminal and the conductor bar 28. At the lower end 22 of each receptacle 14 the solder fills the groove 26 and forms a similar locking ring connection which helps hold the terminal firmly in place on the base board member 17.

After the formation of the solder layer 28 on the conductive bars 18 which also secures the members 14 in place, a layer of potting compound 29 is then applied to both the upper and lower sides of the base board 17. This potting material can be of any suitable type such as epoxy compound and it serves to encapsulate the entire base board including around the receptacle members 14 and covering the conductive paths of solder 28. The potting layers 29 not only insulate the various receptacles and conductive paths from each other, but they also serve to bind together and strengthen the entire structure of the board 13. As the encapsulating compound is applied, it fills the grooves 25 and 27 at the end portions 21 and 22 of all the receptacle members 14. Thus, each receptacle 14 is locked or keyed to the encapsulation layers 29 which further increases the strength of the terminal board 13.

In order to provide a smooth finished exterior surface with added protection to the internal circuitry, I prefer to apply an outside sheet or layer of a suitable rigid plastic material to each side of the board 13. These plastic sheets 30 may be bonded directly to the encapsulating layers 29 by applying them with an appropriate amount of pressure when the encapsulating material is heated and adhesive. When completed, the integrated circuit board 13 is rigid and durable with a hard protective surface which is smooth except for the rows of openings 15 for the receptacles 14. The openings 15 in the upper plastic sheet are tapered inwardly to facilitate easy insertion by a taper pin connector 19, and each terminal opening thus formed is appropriately marked adjacent thereto either by embossed or decaled numbers 16. The thickness of the upper sheet 30 is such that the ends of the receptacles 14 are recessed within the board 13, thus effectively increasing resistance to electrical creepage between adjacent receptacles.

When the terminal board 13 is completely formed as described above, it can be installed at an appropriate location within the aircraft. Near the outer edge of the board are provided a plurality of attachment holes 31 through which mounting screws 32 can be inserted to fix the board 13 to an aircraft frame or bulkhead. As shown in FIG. 4, each mounting screw 32 also serves as a means to ground the board 13 as a whole, as well as to provide a ground connection for any of the circuits within the board. Thus, it will be noted that a pair of soldered conductive paths **28*a* and 28*b* extend around the opening 31 on opposite sides of the base board 17. The opening 31 is counterbored on its upper end 33 so that the head of an attaching screw 32 can fit flush with the outer surface of the board and also contact directly the upper conductive bar 28*a* around the opening. The lower end of the screw 32 is threaded directly into a suitable fitting 34 which may be part of the aircraft structure. The lower end of the opening 31 is also counterbored to receive a metallic bushing 35 around the screw 32, thereby providing a conductive contact between the lower conductive path 28*b* and the aircraft. Therefore, the screw 32 provides a dual function of securing the terminal board 13** as well as providing an electrical ground for it.

As shown in FIG. 5, the principles of my invention may be applied to a modified form of terminal board 40 having two base board members 41 and 42 sandwiched together, each having conductive paths 43 on opposite sides arranged in a predetermined circuit pattern and interconnected electrically by a series of terminal receptacles 44 embedded in the board. The receptacles 44 are similar to the receptacles 14 in that they have a generally cylindrical central body 45, an enlarged upper end 46 and a lower end 47 that extends below the base member 41. However, at their lower end 47 each receptacle 44 is provided with a solid cylindrical extension 48 of a still further reduced diameter that is preferably tapered at its lower end. The upper end portion 46 has an annular groove 49 and a shoulder 50 which are the same in shape and function as those on the receptacle 14. The same is true of a series of annular grooves 51 that are provided in the lower end portion 47.

In order to assemble the terminal board 40 having two or more base members such as 41 and 42, the lower base member 42 is first preformed with the appropriate printed circuit patterns in the aforementioned manner. Then, a series of tubular eyelets 52 are secured in place within holes at predetermined locations in the circuit pattern by flaring their lower end portions on the underside of the base member 42. A layer of solder is now applied to the upper surface of the base member 42, electrically connecting the eyelets to the printed circuit conductive paths thereon. The inside diameter of the eyelets 52 is only slightly larger than the diameter of the lower extended end portion 48 of the receptacles 44 so that the latter will fit snugly within the eyelets. Thus, in constructing the board 40, the upper base member 41 is first formed with the receptacles 44 and 14 locked in place and located at the ends of conductive bars on both sides of the base member 41. A layer 54 of potting material is then applied to the lower surface of the base member 41, and while this material is still soft and pliable the lower preformed base member 42 is pressed against it, the lower extensions 48 of the terminals 44 sliding into the aligned eyelets 52. Pressure and heat, if necessary, which is applied during this latter step assures a firm bond between the potting layer 54 and the upper and lower base members 41 and 42. A layer of solder is now applied to the printed circuit conductive paths in the lower or outer surface of the base member 42 by a suitable method such as dipping. As this layer of solder is applied it flows around the flared ends of the eyelets 52 and the exposed lower ends 48 of the receptacles 44, thus structurally locking the receptacles 44 to the base member 42 as well as electrically bonding them to the conductive circuit paths thereon. After the final application of solder, layers 55 and 56 of potting material are applied to the upper and lower surfaces of the base members 41 and 42 and rigid external boards 57 and 58 are attached in the same manner as with the board 13 using pressure and possibly heat to form a hard durable wear resistant outer covering on the board 40.

If desired, terminal interconnection boards could be made within the scope of the invention having more than two base members such as 41 and 42. In all instances the additional base members other than the upper one retaining the receptacles would be preformed with printed circuitry having eyelets located in alignment with the receptacles so that the board could be assembled with potting material between all base members in the above described manner.

From the foregoing it should be apparent that the present invention provides an interconnection board which solves a serious problem in installing and servicing electronic components where a large multiplicity of leads are involved. While the invention is particularly applicable to the installation of electronic equipment in aircraft it can also be utilized for other electrical systems wherever a compact, well insulated, reliable interconnection unit is required.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A terminal board for interconnecting a large plurality of electrical leads each having a tapered pin connector, said board comprising:

a central base member of non-conductive material;

a series of bars of conductive material forming predetermined conductive paths on said base member;

a plurality of generally cylindrical terminal receptacles located at the ends of said bars and extending through said base member, each said receptacle having a generally cylindrical shape with a tapered axial bore and end portions extending above and below said base member, each said end portion having a surface indentation;

a layer of conductive material on said bars and around said receptacles filling said surface indentations and thereby securing said receptacles within the central base member;

and a layer of non-conductive encapsulation compound covering the opposite sides of said central base member and extending outwardly beyond the layers of conductive material.

2. The terminal board as described in claim 1 including mounting means for attaching said board to a rigid support, and at least one of said layers of conductive bars connected to said mounting means, whereby the board is simultaneously grounded electrically when it is fixed to said support.

3. The terminal board as described in claim 2 wherein said mounting means includes a pair of annular conductive rings at the ends of conductive bars on the upper and lower sides of said central base member, a screw extending through said board including said rings and into said support, the head of said screw engaging the upper ring, and a conductive sleeve contacting the lower ring and the support.

4. A device for interconnecting a large plurality of electrical leads each having a tapered pin connector comprising in combination:

a central base member of non-conductive material;

a printed circuit of conductive material forming a series of predetermined conductive paths on said base member;

a plurality of generally cylindrical terminal receptacles located at the ends of said paths and extending through said base member, each said receptacle having a generally cylindrical main body portion and an enlarged head portion with a tapered axial bore, said head portion and an opposite lower end portion extending above and below said base member, each of said latter portions having a circumferential surface groove;

a layer of conductive material molded to said conductive paths and around each of said receptacles filling said surface grooves and thereby securing said receptacles within the central base member;

a layer of non-conductive encapsulation compound covering the opposite sides of said central base member and extending outwardly beyond the layers of conductive material;

and wear resistant exterior protective means covering each of said encapsulation layers on opposite sides of said printed circuit board, said latter means on one side of said terminal board having openings aligned with said receptacles so that a tapered pin connector on an electrical lead can be inserted into each receptacle.

5. A taper pin receptacle adapted for installation within an electrical terminal board comprising:

a generally cylindrical main body portion having a constant diameter and at least one circumferential surface groove near one end;

an enlarged end portion having a greater diameter than said main body portion and integrally connected thereto by a tapered shoulder, said enlarged end portion having a circumferential surface groove spaced axially from said shoulder, said receptacle having a tapered bore extending axially through said enlarged end portion and into said main body portion for receiving a tapered pin connector fixed to an electrical lead.

6. A taper pin receptacle adapted for installation within an electrical terminal board comprising:

a main body portion of generally uniform cross-section having at least one circumferentially extending indentation located near one end thereof;

an enlarged end portion having a greater cross-sectional area than said main body portion and integrally connected thereto by a tapered shoulder, said enlarged end portion having a circumferentially extending indentation spaced axially between said shoulder and the end of said enlarged end portion, said receptacle having a tapered bore extending axially through said enlarged end portion and into said main body portion for receiving a tapered pin connector fixed to an electrical lead.

7. A taper pin receptacle adapted for installation within an electrical terminal board comprising:

a generally cylindrical main body portion having a constant diameter and a series of spaced apart circumferential surface grooves near its lower end;

an enlarged head end portion having a greater diameter than said main body portion and integrally connected to the upper end thereof by a tapered shoulder, said enlarged head end portion having a circumferential surface groove spaced axially from said shoulder;

a cylindrical pin portion integrally attached to the lower end of said main body portion;

said receptacle having a tapered bore extending axially through said enlarged end portion and into said main body portion for receiving a tapered pin connector fixed to an electrical lead.

8. A terminal board for interconnecting a plurality of electrical components having a multiplicity of leads end connector pins, said board comprising:

a first base member of non-conductive material having a predetermined printed circuit pattern on opposite sides made up of a series of bars of conductive material;

a plurality of terminal receptacles extending through said first base member at predetermined locations relative to said printed circuit patterns, each said receptacle having an enlarged portion at one end and an indentation at its other end and a tapered axial bore, said receptacles being locked in position on said first base member by conductive material extending around each receptacle and bonded to said bars and said terminals at said indentation, at least some of said receptacles having a cylindrical pin extension at its lower end;

a second base member having a series of tubular conductive connector fittings fixed therein and interconnected by conductive bars in a predetermined circuit pattern, said lower end pin extensions on said terminal receptacles being fitted snugly within said tubular connector fittings of said second base member;

and a layer of non-conductive encapsulation compound located between said first and second base members and similar layers covering the outer sides of said first and second base members while extending above the level of said conductive bars thereon.

9. A terminal board comprising:

a first base member of non-conductive material having a predetermined printed circuit pattern on opposite sides made up of a series of bars of conductive material;

a plurality of terminal receptacles extending through said first base member at predetermined locations relative to said printed circuit patterns, each said receptacle having an enlarged head at its upper end connected by a tapered shoulder to a main body portion within said first base member, a circumferential indentation at the lower end and a tapered axial bore extending through said head and into said body portion, each receptacle being locked in position on said central base member by conductive material extending around said head end at said shoulder and bonded to said bars and said terminals at said indentation, at least some of said receptacles having a cylindrical pin extension at its lower end;

a second base member having a series of tubular conductive fittings fixed therein and interconnected by conductive bars in a predetermined circuit pattern, said lower end pin extensions on said receptacles being fitted snugly within said tubular conductive fittings of said second base member;

and a layer of non-conductive encapsulation compound located between and also covering the outer sides of said first and second base members while extending above the level of said conductive circuit bars thereon.

10. A terminal board for interconnecting a large plurality of electrical leads each having a tapered pin connector, said board comprising:

a central base member of non-conductive material;

a series of bars of conductive material forming predetermined conductive paths on opposite surfaces of said base member;

a plurality of generally cylindrical terminal receptacles located at the ends of said bars and extending through said base member, each said receptacle having a generally cylindrical shape with a tapered axial bore and upper and lower end portions extending above and below said base member, both said end portions having means forming a circumferential shoulder located near an adjacent surface of the base member;

a layer of conductive material around said receptacles and located at said circumferential shoulders for securing said receptacles within the central base member;

and a layer of non-conductive encapsulation compound covering the opposite sides of said central base member and extending outwardly beyond the layers of conductive material, said compound on one side of said terminal board being around said receptacles so that openings to their bores are exposed and a tapered pin connector on an electrical lead can be inserted into each receptacle.

11. A terminal board for interconnecting the electrical leads of a plurality of electrically operated components, comprising:

a central base member of non-conductive material;

a first and a second group of receptacles fixed in said board;

conductive bars forming paths interconnecting receptacles of said first group with receptacles of said second group in a predetermined pattern, all of said receptacles having a tapered axial bore and upper and lower end portions extending above and below said central board with circumferential shoulder means on said end portions, and being locked in position on said central base member by conductive material extending around said receptacle end portions at said shoulder means and on said bars;

encapsulating means on said central board surrounding said upper end portions of said receptacles extending above said central board and exposing openings to their axial tapered bores;

and indicia on said latter means providing an identifying designation for each receptacle; whereby taper pin male connectors on leads from said electrical components can be inserted into the receptacles to provide electrical continuity between said components in accordance with the prearranged pattern of conductive bars on said board.

References Cited by the Examiner

UNITED STATES PATENTS

| | | | |
|---|---|---|---|
| 1,939,130 | 12/1933 | Mills | 339—17 |
| 2,441,960 | 5/1948 | Eisler | 339—17 X |
| 2,447,541 | 8/1948 | Sabee et al. | 339—17 X |
| 2,502,291 | 3/1950 | Taylor | 339—17 X |
| 2,756,485 | 7/1956 | Abramson et al. | 29—155.5 |
| 2,909,833 | 10/1959 | Murray et al. | 339—17 X |
| 2,915,678 | 12/1959 | Frazier et al. | 174—68.5 X |
| 2,922,135 | 1/1960 | Hoberg et al. | 339—18 |
| 2,958,064 | 10/1960 | Swengel | 339—17 |
| 2,958,845 | 11/1960 | Dupre et al. | 339—273 X |
| 3,052,957 | 9/1962 | Swanson | 29—155.5 |
| 3,093,887 | 6/1963 | Prestige et al. | 339—273 X |
| 3,097,032 | 7/1963 | Hochheiser | 339—17 |

FOREIGN PATENTS

| | | |
|---|---|---|
| 70,102 | 10/1958 | France. |
| 556,548 | 10/1943 | Great Britain. |

EDWARD C. ALLEN, *Primary Examiner.*

PATRICK A. CLIFFORD, *Examiner.*